United States Patent [19]

Mitchell, Jr.

[11] Patent Number: 4,495,590
[45] Date of Patent: Jan. 22, 1985

[54] PLA WITH TIME DIVISION MULTIPLEX FEATURE FOR IMPROVED DENSITY

[75] Inventor: Ralph C. Mitchell, Jr., Kingston, N.Y.

[73] Assignee: International Business Machines Corp., Armonk, N.Y.

[21] Appl. No.: 542,230

[22] Filed: Oct. 14, 1983

Related U.S. Application Data

[63] Continuation of Ser. No. 221,595, Dec. 31, 1980, abandoned.

[51] Int. Cl.³ .............................................. H03K 19/20
[52] U.S. Cl. ................................... 364/716; 307/465; 364/758
[58] Field of Search ....................... 364/716, 758, 900; 307/465; 340/825.83, 825.84, 825.87

[56] References Cited

U.S. PATENT DOCUMENTS

| | | | |
|---|---|---|---|
| 3,958,110 | 5/1976 | Hong et al. | 371/15 |
| 3,987,286 | 10/1976 | Muehldorf | 364/716 |
| 3,987,287 | 10/1976 | Cox et al. | 364/716 |
| 4,034,356 | 7/1977 | Howley et al. | 307/465 |
| 4,037,089 | 7/1977 | Horninger | 364/716 |
| 4,084,152 | 4/1978 | Long et al. | 364/716 X |
| 4,207,556 | 6/1980 | Sugiyama et al. | 340/825.84 |
| 4,336,601 | 6/1982 | Tanaka | 364/900 |

Primary Examiner—David H. Malzahn
Attorney, Agent, or Firm—W. S. Robertson

[57] ABSTRACT

In this programmable logic array (PLA), internal array lines are shared by several sets of input array lines. Each set of input lines operates on a separate time phase. This PLA construction is denser than some other arrangements of multiple PLAs, and some of its components are reduced in number as compared with multiple independent PLAs for the same functions. A new pipelined multiplier is disclosed as one application for the PLA of this invention. In another application for this PLA, the array lines are shared where the array locations that are otherwise required for don't care states have been eliminated and a denser construction is provided.

3 Claims, 3 Drawing Figures

PLA WITH TIME DIVISION MULTIPLEX FEATURE FOR IMPROVED DENSITY

This is a continuation of application Ser. No. 221,595 filed Dec. 31, 1980, now abandoned.

FIELD OF THE INVENTION

This invention relates to a semiconductor array logic device. These devices are adapted to be "personalized" or "programmed" to perform a particular logic function and for this reason such a device is commonly called a "programmable logic array" or a "PLA." The invention more specifically relates to a new organization of arrays and associated components on a semiconductor chip.

INTRODUCTION

An array logic device has row lines and column lines and a pattern of interconnections at the cross-over points of these lines. One set of the lines, for example the column lines, carries binary input signals and the other set, the row lines in this example, carries the output signals. The logical relationship between the input signals and the output signals is established by the pattern of the interconnections at the crossover points. These interconnections are typically formed by semiconductor diodes or either bipolar or field effect transistors (FETs). The parallel connection of several FETs along a row or column line forms an OR invert circuit. An invert at the input to an array gives the array an AND function and alternatively an invert on the output gives the array an OR function.

A PLA ordinarily has two arrays, an AND array, for example, followed by an OR array so that the PLA function on each output of the OR array can be represented as a sum of product terms. In such an arrangement, the row lines of the OR array form the input lines and are a simple extension of the row output lines of the AND array and the column lines form both the input lines (to the AND array) and the output lines (from the OR array). With this arrangement the AND and OR arrays for a single PLA occupy a dense rectangular area on the chip.

OBJECTS OF THE INVENTION

It is usually desirable to locate several PLA's on the same semiconductor chip. A general object of this invention is to improve the packing density of these PLA's. An example of a known prior art multi-PLA chip will help to illustrate this object. In this prior art device, the arrays are formed in a checkerboard pattern with the dark squares of the board representing the area of the arrays and the light squares representing the space that is required simply to extend the input column lines to a peripheral point of contact with other components on the chip.

SUMMARY OF THE INVENTION

According to this invention, the general checkerboard arrangement that has been described is improved by locating an additional array along the row line positions that would otherwise be used only for carrying signals from an AND array to an OR array. Thus in the simplest case of two PLA's, two sets of column lines pass through the AND arrays of the two PLA's occupying a dense rectangular area on the chip.

The two PLA's are time division multiplexed to share the common row lines. For this function it is preferable to share the row lines and to provide individual sets of column lines. From a more general standpoint, the internal lines (in this example, the row lines) are shared and the external input lines (in this example, the column input lines to an AND array) are not shared. Gates that are otherwise available on these input lines are connected to control signals for the multiplex function (or gates along the periphery of the PLA can be dedicated to the multiplex function).

The invention includes a new pipelined multiplier that takes advantage of this time division multiplex organization of a PLA.

One advantage of the invention is that current sources that are connected to the row lines in some PLAs can also be shared to further reduce the physical size of the array. Other objects and advantages will be described later.

THE DRAWING

Figure 1:
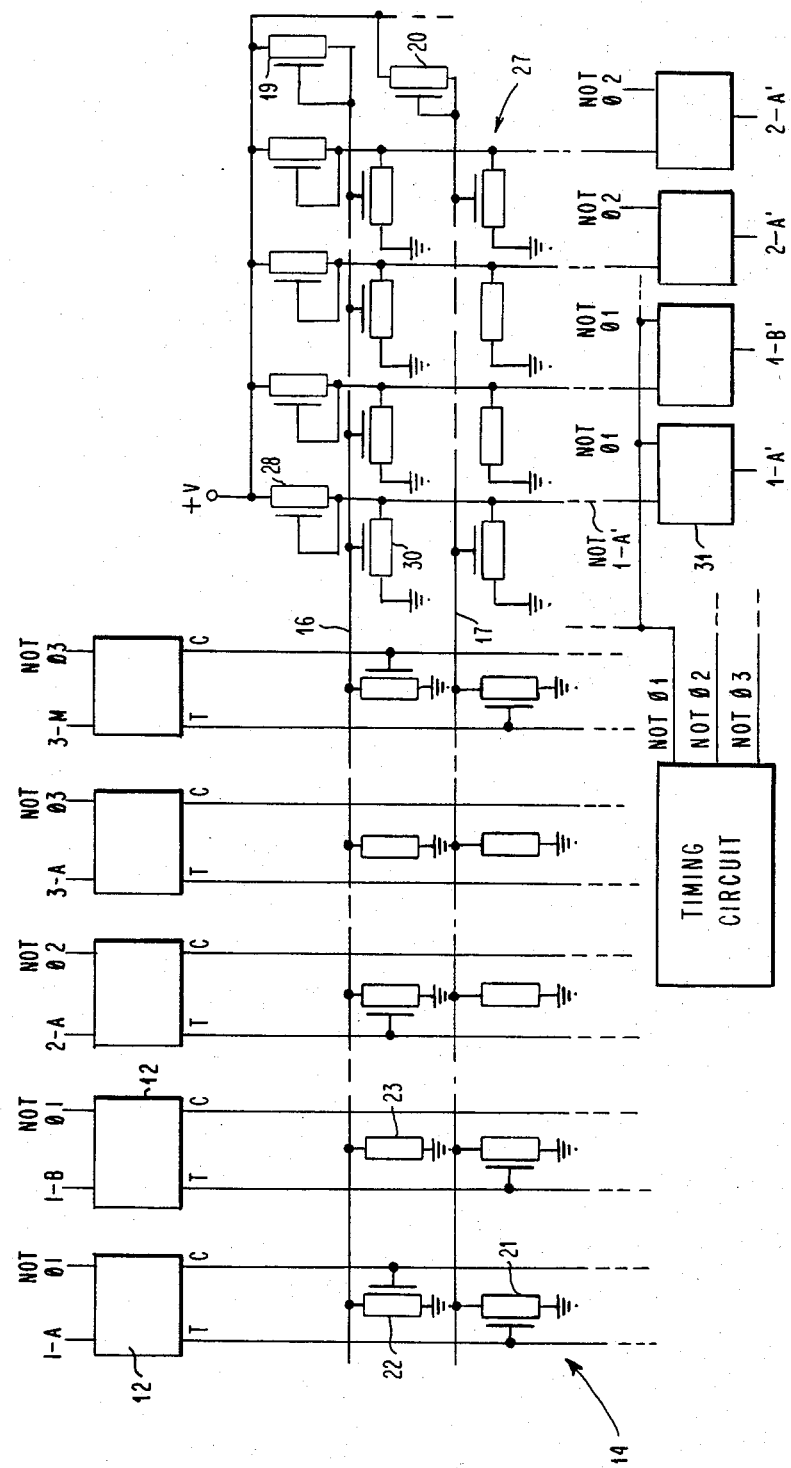
FIG. 1 is a schematic that shows the array structure of a PLA constructed according to this invention.

Conventional Features—FIG. 1

It will be helpful to consider first the components of the PLA that operate conventionally on a single input variable to produce a single output. Some of the additional components of the invention will be introduced during this preliminary description and then discussed in more detail later.

In FIG. 1 the input signals are applied along column lines at the top of the drawing, the product term lines are formed in rows, and the outputs emerge along column lines at the bottom of the drawing, as in the convention that was introduced in the introductory portion of this specification. Representative input signals and the associated lines are designated 1-A, 1-B, 2-A, 3-A, and 3-m. The prefix numbers identify the phase of the operating cycle during which the inputs are operated on in the PLA. For this preliminary description, only the operation of phase 1 will be described. The letter suffixes A, B ... m represent bit positions of an input word that has a generalized length designated m. At the output of the PLA the signals are similarly designated with a suffix carrying a prime, as, 1-A'.

The inputs are applied to circuits 12 that perform a conventional bit partitioning operation. The drawing illustrates a 1 bit partition in which a conventional powering and inverting circuit forms the true and complement of the input variable. It also performs a gating function in the PLA of this invention. It is shown in detail in FIG. 2 and will be described later.

The output lines from the bit partitioning circuits form the columns of the AND array 14. The AND array has representative row lines or product term lines 16, 17. An FET 19, 20 for each row line supplies a current to the associated row line. The AND array has representative FET's 21, 22, 23 that each has its drain terminal connected to an associated row line and its source connected to ground. The gate terminal is selectively connected to the true column line on the left or to the complement column line on the right or it can be left unconnected, as FET's 21, 22, and 23 illustrate respectively.

The OR array 27 is similar to the AND array. An FET 28 supplies current to a column line Not 1-A'. A representative FET 30 has its gate connected to row line 16 and its drain connected to column line Not 1-A'. Row line 16 is connected to the input of a conventional powering and inverting circuit and latch 31. (Circuit 31 is shown in detail in FIG. 2 with additional components that provide a gating function, as will be described later.) The other column output lines are similarly connected to individual latch circuits.

Figure 2:
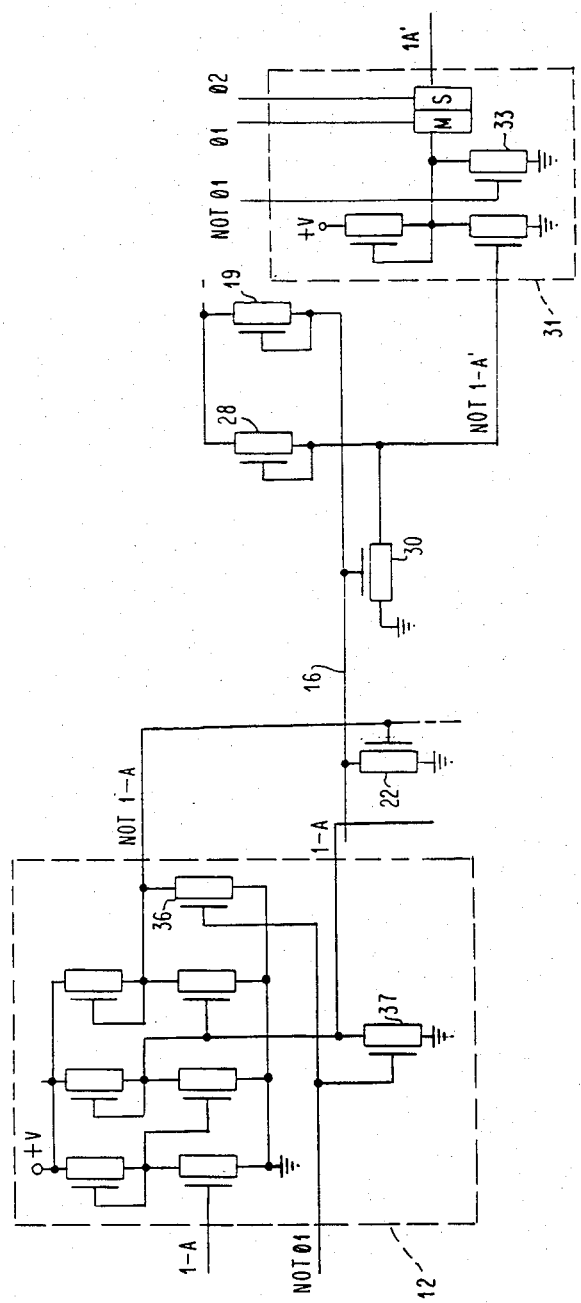
FIG. 2 is a schematic of an input circuit and an output circuit of the PLA of FIG. 1 and the connecting path through the AND and OR arrays.

Conventional Features—FIG. 2

FIG. 2 shows the bit partitioning circuit 12 for input bit 1-A, the output latch circuit 31, and a connecting path through the arrays that includes FET 22 in the AND array and FET 30 in the OR array. Input 1-A is applied to a circuit of three inverter stages that produce the complement phase of the input at the output of the third stage and the true phase of the input at the output of the second stage. (FET's 36 and 37 and the signal Not ∅-1 will be described later.)

Suppose that the logic function that is to be performed at output 1-A' is 1-A=1. That is, output 1-A' is to be up when input 1-A is up and it is to be down when input signal 1-A is down. Suppose that input signal 1-A is up, representing 1-A=1. The FET in the first stage is turned on by this signal at its gate, and the output of the first stage is down. The output of the second stage is up and the signal level of the true phase output is up. Similarly the output of the third stage is down and the column line Not 1-A is down, representing Not 1-A=0.

Because the gate of FET 22 is connected to the complement line, Not 1-A, which is down, FET 22 remains off. That is, FET 22 does not conduct in circuit with row line 16 and the current source formed by FET 19, and row line 16 remains up. The up level on line 16 turns on FET 30 in the OR array and it sinks the current from the current source formed by FET 28 and produces a low level on column output line Not 1-A'. Line Not 1-A' applies a low level to the input of the latch circuit 31.

The latch circuit 31 has a conventional input inverter stage and it has a conventional master/slave latch. At a time ∅-1 data is loaded into the input or master stage and at a time ∅-2 data is shifted from the input stage to an output or slave stage. In this example, the down level of the signal on column output line 1-A' is inverted to an up level to set the latch.

To continue this example, if 1-A=0 at the input to the bit partitioning circuit, the signal on the complement column line is made high and FET 22 is turned on. FET 30 remains OFF and column line Not 1-A' remains up. The input to the latch is down and the latch remains reset and its output 1-A' remains down to signify 1-A=0.

The operation of the PLA on several input variables such as 1-A and 1-B can be readily understood. In the specific example of the drawing, the PLA produces the function 1-A'=A+(Not A, Not B). Notice that if any input signal (1-A or 1-B in this example) does not satisfy the logic condition of the function that is being implemented along a row line, it turns on one of the FET's in the AND array and this conducting FET turns off the single FET in the OR array for the associated row. The down level of the column line is inverted to set the latch. When any FET along a column of the OR array is turned on, it produces the down level at the input to the latch circuit that is inverted to set the latch. If no FET along the column line is turned on, the latch remains reset.

Timing Signals for ∅-1

Timing signals ∅-1 and Not ∅-1 disable the components of the ∅-1 logic except at ∅-1 time so that other phases of logic can share the row or product term lines 16, 17 and the associated current sources 19, 20. In response to a signal Not ∅-1, FET's 36 and 37 in bit partitioning circuit hold down both the true and complement column lines 1-A and Not 1-A. From the description of the operation of the array, it can be seen that no FET in the ∅-1 section of the AND array can be turned on except at ∅-1 time when the signal Not ∅-1 is down. In the latch circuit, an FET 33 similarly responds to Not ∅-1 to maintain a down level signal at the latch input.

Operation—FIG. 1

A conventional timing circuit provides signals that define a repeating sequence of equal time periods ∅-1, ∅-2 and ∅-3 that are each represented by an up level on the corresponding signal lines. The complement or down level signals are Not ∅-1=∅-2+∅-3, Not ∅2=∅-1+∅-3, and Not ∅-3=∅-1+∅-2 as is conventional in other multiphase apparatus. Thus, at time ∅-1, FETs 36 and 37 are off and bit partitioning circuit 12 for bit 1-A and the corresponding circuits for other bits of group 1 are conditioned to put signals on the true or complement column lines of the AND array. FETs corresponding to FETs 36 and 37 in the bit partitioning circuits for the other phases are on and these circuits are inhibited from putting up level signals on their column lines. Similarly, in the latch circuit 31 for output bit 1-A' and the other latches for output group 1 FETs 33 are OFF and these output circuits are conditioned to respond to the signal on the associated column line. The FETs corresponding to FET 33 for the other stages are ON and these circuits are inhibited from changing their latch states in response to the signal on the associated column line.

The master latches for the group 1 outputs are loaded at ∅-1 time and data is transferred to the slave latch at ∅-2 time where it is available at the output of the PLA. At ∅-2 time, the bit partitioning and latch circuits for the group 2 inputs and outputs are enabled and the other bit partitioning circuits and latch circuits are inhibited, and at ∅-3 time the input and output circuits of group 3 are enabled and the others are inhibited. The latches are provided with conventional means, not shown, for being reset, either by the phase signals already described or by a timing signal derived from the arrays.

A Multi-Phase PLA Multiplier

Figure 3:
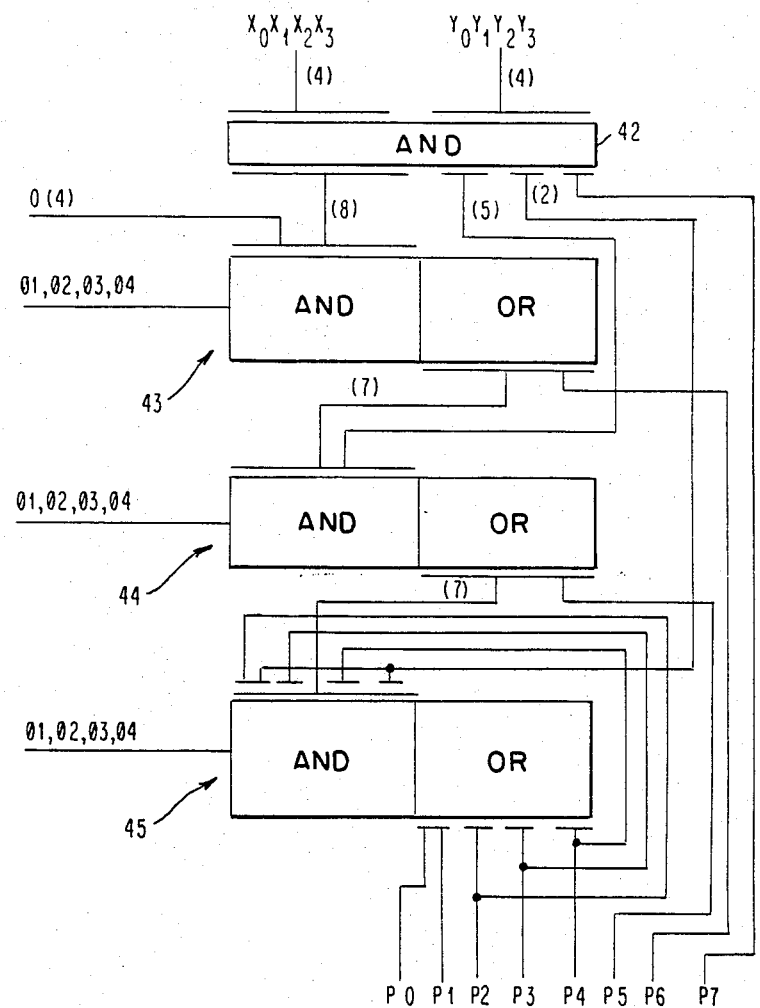
FIG. 3 is a schematic of a pipelined multiplier constructed with multiphase PLA's according to this invention.

To illustrate the structure and operation of the multiplier of FIG. 3, two multi-bit numbers or data words that are to be multiplied are designated $X_0X_1X_2X_3$ and $Y_0Y_1Y_2Y_3$. The subscripts are register stage positions from left (high order) to right (low order). It will be helpful to review the pencil and paper multiplication of these numbers in which pairs of digits are multiplied to form partial products, the partial products are arranged in columns that signify powers of 2, and the columns are added with carries from columns to the right. Recall that the product of two bits is their AND logic function.

TABLE 1

| $Y_0$ | $Y_1$ | $Y_2$ | $Y_3$ |
|---|---|---|---|
| $X_0$ | $X_1$ | $X_2$ | $X_3$ |

TABLE 1-continued

|  |  |  |  | $X_3Y_0$ | $X_3Y_1$ | $X_3Y_2$ | $X_3Y_3$ |
|---|---|---|---|---|---|---|---|
|  |  |  | $X_2Y_0$ | $X_2Y_1$ | $X_2Y_2$ | $X_2Y_3$ |  |
|  |  | $X_1Y_0$ | $X_1Y_1$ | $X_1Y_2$ | $X_1Y_3$ |  |  |
|  | $X_0Y_0$ | $X_0Y_1$ | $X_0Y_2$ | $X_0Y_3$ |  |  |  |
| $P_0$ | $P_1$ | $P_2$ | $P_3$ | $P_4$ | $P_5$ | $P_6$ | $P_7$ |

The sum is represented as an eight bit number P0 P1 P2 P3 P4 P5 P6 P7.

In the circuit of FIG. 3, a set of sixteen AND gates 42 receives the four bits of Word X and the four bits of Word Y and produces the sixteen partial products shown in Table 1. Three identical PLA's 43, 44, 45 are arranged to pipe line the multiplication operation. That is, the column output lines from the OR arrays of PLA's 43 and 44 are connected to the column input lines to the AND arrays of PLA's 44 and 45 respectively. The PLA is described in the following table.

TABLE 2

| | AND | | | | OR | | | |
|---|---|---|---|---|---|---|---|---|
| Row | ∅1 | ∅2 | ∅3 | ∅4 | ∅1 | ∅2 | ∅3 | ∅4 |
| 1 | 0UU | 0UU | 0UU | 0UU | 1 | 1 | 1 | 1 |
| 2 | 1EE | 1EE | 1EE | 1EE | 1 | 1 | 1 | 1 |
| 3 | 1UU | 1UU | 1UU | 1UU | 1 | 1 | 1 | 1 |
| 4 | 11 | 11 | 11 | 11 | 1 | 1 | 1 | 1 |
| Column | 123 | 456 | 789 | 10 | 13 | 15 | 17 | 19 |
|  |  |  |  | 11 | 14 | 16 | 18 | 20 |
|  |  |  |  | 12 |  |  |  |  |

In the table, rows 1-4 represent the shared product term lines as already described. Each column 1-12 of the AND table represents either two column input lines of the array formed by one bit partitioning circuits as in FIG. 1 or it represents two column lines formed by conventional two bit partitioning circuits as will be explained. In the OR array each column represents a single output line as in FIG. 1.

Each phase of the AND array has 3 columns. Column 1 (and columns 4, 7 and 10) receives the carry in. A 0 in this column signifies that the AND function along the row is satisfied when the input variable bit is a 0 and it is not satisfied when the input variable is a 1. A 1 in column 1 similarly signifies that the AND function is satisfied by a 1. A blank signifies no connection, a logical "don't care". This column can be implemented by a 1 bit partitioning circuit as in FIG. 1 (or it can be implemented as a two bit partitioning circuit with a dummy input). In columns 2 and 3 (and in columns 5 and 6, 8 and 9, and 11 and 12), the row sequence UU signifies that the two inputs are applied to a two bit partitioning circuit. The AND function for the row is satisfied by unequal values of the two inputs to columns 2 and 3. As an example, suppose that the two inputs for columns 2 and 3 are designated A and B respectively. The two bit partitioning circuit produces the four terms (Not A, Not B) (Not A,B) (A,B) and (A,Not B). The logical products that satisfy the unequal condition are (Not A, B) or (Not B,A) (the Exclusive OR function). In the circuit illustrated by FIG. 2, this function is implemented by connecting the column lines for (A, B) and (Not A, Not B) to gate terminals of FET's of row 1 and leaving the lines for (Not A, B) and (A, Not B) unconnected for row 1. Similarly the notation EE for columns 2 and 3 of row 1 mean that the inputs A and B are equal (the complement Exclusive OR function). This is the complement of the UU function in row 1 and is formed by the complementary connection of the column lines.

In the OR array a 1 signifies that the AND function of the row enters the OR function of the column as in FIGS. 1 and 2.

The adder function of the PLA can be understood from the following table, using A and B as generalized bits to be added and C as a carry in.

| AND Array | AND Logic Function | OR Logic Function |
|---|---|---|
| 0 U U | (Not C)(A,Not B+Not A,B) | } Sum |
| 1 E E | C,A,B+C Not A, Not B | |
| 1 U U | C(Not A,B)+C(A,Not B) | } Carry |
| 1 1 | A,B | |

Thus, columns 11, 13, 15 and 17 of the OR array produce the carry out bit and columns 12, 14, 16 and 17 produce the sum bit.

The Circuit of FIG. 3

In the pipelined multiplication circuit of FIG. 3, a set of sixteen AND gates receives the two four-bit numbers that are to be multiplied and it produces the sixteen logical products that are shown in Table 1. Three PLAs 43, 44, 45 receive these products and they produce carries, intermediate sums, and the bits of the final product which are designated P0-P7. Each PLA is identical and preferably uses the array logic pattern of Table 2. The pipelined arrangement used in FIG. 3 uses the permanent connections shown in the drawing to keep the intermediate sums and carries in the proper column as represented by Table 1.

The specific connections that are shown in FIG. 3 are given in Table 4. The general flow of information can be understood from the following summary. The term $X_3Y_3$ appears directly as product bit P7 and is not applied to the PLAs. The eight low order terms are applied to PLA 43 where sums and carries are produced at the output. (Since there are no carries into this stage, four 0 bits are applied to columns 1, 4, 7 and 10 of this PLA.) One of these sum bits is product bit P6. The other three sums and the four carries are applied to the next PLA 44. Five terms from AND circuits 42 are also applied to this PLA. One of the sums from PLA 44 is product bit P5. The other sums and the carries and two terms from the AND count are applied to the next PLA 45. The four sums and one carry from this PLA form product bits P0-P4.

TABLE 4

| PLA 43 Inputs and Outputs | |
|---|---|
| ∅1 X3Y2 + X2Y3 | C4, P6 |
| ∅2 X2Y2 + X1Y3 | C3, S3 |
| ∅3 X1Y2 + X0Y3 | C2, S2 |
| ∅4 X0Y2 + X1Y1 | C1, S1 |
| PLA 44 Inputs and Outputs | |
| ∅1 C4 + S3 + X3Y1 | C8, P5 |
| ∅2 C3 + S2 + X2Y1 | C7, S7 |
| ∅3 C2 + S1 + X2Y0 | C6, S6 |
| ∅4 C1 + X0Y1 + X1Y0 | C5, S5 |
| PLA 45 Inputs and Outputs | |
| ∅1 C8 + S7 + X3Y0 | C12, P4 |
| ∅2 C7 + S6 + C12 | C11, P3 |
| ∅3 C6 + S5 + C11 | C10, P2 |
| ∅4 C5 + X0Y0 + C10 | P0, P1 |

In this table the carry bits and the intermediate sum bits are designated C and S with an identifying suffix. The advantage of the four phase organization of the PLA is shown in the circuit of PLA 45. At phase 1 time, the PLA generates a sum P4 and it generates the carry C12. This carry is available at the output of a latch 31 at phase 2 time and is applied to the input of the phase 2 logic of the same PLA. Similarly, the phase 2 logic produces a product bit P3 and it produces a carry that is applied to the phase 3 logic. The phase 3 logic similarly produces a product bit P2 and a carry in to the phase 1 logic.

Other Embodiments

The multi phase organization of the PLA of this invention can also be used to improve further the density of an array. A particular single-phase array may have a large number of don't care states for which there is no connection to an FET at a crosspoint in the array. See Table 5. A pair of symetrical cuts can be made through the array, conceptually to remove a significant section of don't care crossover points, and, physically to divide the column lines into two sets. One set is driven from the top of the array at phase 1 time and the other set is driven from the bottom of the array at phase 2 time. In the two phase array represented in Table 5, dashes show the cut lines. The techniques for driving an array from opposite ends are well known.

TABLE 5

| Row | Single-Phase Array | | | | | Two-Phase Array | | | | | |
|---|---|---|---|---|---|---|---|---|---|---|---|
| 1 | 1 | 1 | 1 | 1 | 1 | | 1 | 1 | 1 | 1 | 1 |
| 2 | 0 | 1 | 1 | 1 | 1 | | 0 | 1 | 1 | 1 | 1 |
| 3 |   | 0 | 1 | 1 | 1 | 1 | 0 | 0 | 1 | 1 | 1 |
| 4 |   |   | 0 | 1 | 1 | 1 | 1 | 0 | 0 | 1 | 1 |
| 5 |   |   |   | 0 | 1 | 1 | 1 | 1 | 0 | 0 | 1 |
| 6 | 1 | 0 |   |   |   | | 1 | 1 | 1 | 1 | 0 |
| 7 | 1 | 1 | 0 |   |   | | 1 | 1 | 1 | 1 | 1 |
| 8 | 1 | 1 | 1 | 0 |   | | | | | | |
| 9 | 1 | 1 | 1 | 1 | 0 | | | | | | |
| 10 | 1 | 1 | 1 | 1 | 1 | | | | | | |

From this description of several embodiments of the invention, those skilled in the art will find various application for the invention with suitable modifications of the specific apparatus of this specification, within the skill of the art and the scope of the claims.

Having thus described my invention, what I claim as new, and desire to secure by Letters Patent, is:

1. In a PLA of the type having
    an array having input lines, output lines, and internal lines crossing over the input and output lines, and interconnection elements in a predetermined pattern at crossover points of the array,
    means for supplying logic signals to be operated on by the array, and input circuits connected to receive a binary number of said logic signals and connected to a binary number of said input lines of the array for supplying partitioning functions of said logic signals to the connected input lines, where a binary number is a non-negative integral power of 2, and
    output circuits for receiving logic signals from the output lines of the array,
    wherein the improvement comprises,
    means for producing timing signals defining a plurality of timing phases,
    means connecting each of said timing signals to a disjunct plurality of said input circuits, whereby each timing phase corresponds to a set of input lines of the array, and means in each input circuit responsive to its timing signal to enable the input circuit to supply said partitioning function and responsive to the complement of its timing signal to inhibit the input circuit, and
    means connecting said timing signals to said output circuits and means in each output circuit responsive to its phase of the timing signals to enable the associated output circuit to receive and store a signal on the associated output line and responsive to the complement of said corresponding phase to inhibit the output circuit,
    whereby the internal lines of the PLA are shared by a plurality of sets of input lines, each set having a selected logic function that is enabled at a separate time phase in the operation of the array.

2. The PLA of claim 1 in which said internal lines and input lines are arranged along rows and columns of interconnection elements and wherein each of said input lines is divided to form two separate portions and wherein pairs of said input circuits are located on opposite edges of the array and connected to drive separate portions of a divided input line, the improvement
    wherein said means for producing timing signals includes means for producing timing signals of opposite phase,
    and wherein one input circuit of each said pair of input circuits includes means responsive to timing signals of one of said opposite phases and the other input circuit of each pair includes means responsive to timing signals of the other of said opposite phases for operating said separate portions of a divided input line at different time phases,
    said input line portions being of selected lengths to share portions of the internal lines of the array on said opposite time phases,
    said interconnections being arranged in the shared portion of the array for representing "don't care" states in the logic functions implemented in the opposite time phases.

3. The PLA of claim 1 connected as a binary multiplier of the type in which multiplication occurs by a sequence of additions in which sums and carries are produced,
    wherein the interconnection elements are arranged to form at the output lines of the array the sums and carries of logic signals supplied to said input lines,
    and including connecting the carries from the output lines of one time phase to the input lines for the next time phase to provide a carry propagate function.

* * * * *